(12) United States Patent
Macke, Sr. et al.

(10) Patent No.: US 6,446,012 B1
(45) Date of Patent: Sep. 3, 2002

(54) PROXIMITY DETECTOR FOR HARD-TO-DETECT MATERIALS

(75) Inventors: David C. Macke, Sr., Glendale; Richard A. Livingston, Webster Groves, both of MD (US); Roger D. Chamberlain, St. Louis, MO (US); Jon G. Metcalf, Glen Carbon, IL (US)

(73) Assignee: BFCS Technology, Inc., St. Louis, MO (US)

( * ) Notice: Subject to any disclaimer, the term of this patent is extended or adjusted under 35 U.S.C. 154(b) by 0 days.

(21) Appl. No.: 09/338,366

(22) Filed: Jun. 23, 1999

(51) Int. Cl.$^7$ ............................................... G08B 21/00
(52) U.S. Cl. ............................. 702/22; 702/33; 702/45; 702/47; 702/108; 702/183
(58) Field of Search ............................... 702/33, 45, 47, 702/50, 52, 53, 55, 57, 65, 64, 100, 108, 113, 114, 127, 150, 152, 155–158, 166, 183, 184, 188, 189, FOR 103–FOR 104, FOR 105–106, FOR 123–124, FOR 127–128, FOR 134–135, FOR 141, FOR 144; 700/281; 324/681, 682, 674, 675; 331/65, 182, 117, 183, 175, 176; 340/507, 620

(56) References Cited

U.S. PATENT DOCUMENTS

| | | | | |
|---|---|---|---|---|
| 3,697,971 A | | 10/1972 | Domin et al. ................ 340/258 |
| 3,701,041 A | * | 10/1972 | Adler et al. ................... 331/65 |
| 3,732,538 A | | 5/1973 | Gillund et al. ................ 340/52 |
| 3,781,772 A | * | 12/1973 | Inoue et al. ................. 340/1 R |
| 3,801,799 A | | 4/1974 | Atkins ......................... 307/116 |
| 3,807,231 A | | 4/1974 | Spaw ............................ 73/290 |
| 3,820,100 A | * | 6/1974 | Ballinger et al. ........... 340/258 |
| 3,973,208 A | | 8/1976 | Diamond ........................ 328/5 |
| 4,091,833 A | * | 5/1978 | Ellis et al. .................... 137/93 |
| 4,144,529 A | | 3/1979 | Miller et al. ................ 340/562 |
| 4,173,755 A | | 11/1979 | Butler ......................... 340/562 |
| 4,325,058 A | | 4/1982 | Wagner et al. .............. 340/562 |
| 4,345,167 A | | 8/1982 | Calvin ......................... 307/308 |
| 4,347,741 A | * | 9/1982 | Geiger ......................... 73/304 |
| 4,366,451 A | * | 12/1982 | Kowal .......................... 331/20 |
| 4,598,260 A | * | 7/1986 | Carr ............................ 331/135 |
| 5,025,222 A | * | 6/1991 | Scott et al. ................. 324/639 |
| 5,034,704 A | * | 7/1991 | Tomioka et al. .............. 331/65 |
| 5,241,280 A | * | 8/1993 | Aidun et al. ................ 324/671 |
| 5,264,809 A | * | 11/1993 | Tamino ........................ 331/65 |

(List continued on next page.)

*Primary Examiner*—Marc S. Hoff
*Assistant Examiner*—Carol Tsai
(74) *Attorney, Agent, or Firm*—Bryan Cave LLP (57) ABSTRACT

A proximity detection system for detecting the proximity of conventionally hard-to-detect materials having a complex permittivity and/or a complex permeability is disclosed. The system includes an oscillator for producing an output signal, the oscillator having a transistor with an open and a closed loop gain and a base-emitter junction that rectifies resonant signals at the collector to produce the output signal. The oscillator includes negative feedback including a resistive element coupled to the emitter for reducing the sensitivity of the closed loop gain to variations in the transistor's open loop gain and a capacitive element coupling the resistive element to the collector for stabilizing the frequency of the oscillator. The detection system further includes a sensor coupled to the oscillator for varying the level of the oscillator output signal in response to certain electrical properties of the material. Control means are also included operatively coupled to the oscillator to receive the oscillator output signal and respond to variations of predetermined magnitudes of the amplitudes of the oscillator output signal for detecting the presence or level of the material. The sensor is designed to reposition the polarization orientation of the electric field lines extending therefrom such that the field lines extend a greater distance outwardly from the surface of the sensor.

21 Claims, 6 Drawing Sheets

U.S. PATENT DOCUMENTS

| | | | | |
|---|---|---|---|---|
| 5,428,253 A | * | 6/1995 | Ogata et al. | 307/116 |
| 5,463,378 A | * | 10/1995 | Gibb | 340/618 |
| 5,550,516 A | * | 8/1996 | Burns et al. | 331/65 |
| 5,730,165 A | | 3/1998 | Philipp | 137/1 |
| 5,748,002 A | * | 5/1998 | Scott et al. | 324/633 |
| 5,760,688 A | * | 6/1998 | Kasai | 340/561 |
| 5,801,593 A | * | 9/1998 | Nguyen | 331/113 R |
| 5,832,772 A | | 11/1998 | McEwan | 73/290 |
| 5,982,820 A | * | 11/1998 | Limberg | 375/326 |
| 6,107,924 A | * | 8/2000 | Kasai et al. | 340/627 |
| 6,125,642 A | * | 10/2000 | Seener et al. | 62/193 |
| 6,166,551 A | * | 12/2000 | Scott et al. | 324/637 |

* cited by examiner

```
loop
    61 ⎧ enable gate signal to oscillator
       ⎨ read output of comparator
       ⎩ disable gate signal to oscillator
        if oscillations present (no material in proximity to sensor) then
                ⎧ if oscillations absent in previous loop iteration then
            62 ⎨         set LED to flashing amber
                ⎨         initiate timer
                ⎩ endif
                ⎧ if timer elapsed then
                ⎪         set LED to solid amber
            63 ⎨         open normally open control output
                ⎪         close normally closed control output
                ⎩ endif
        else (material in proximity to sensor)
            64 ⎧ set LED to green
                ⎨ close normally open control output
                ⎩ open normally closed control output
        endif
    65 ⎧ if button pressed then
       ⎨         perform user interface functions
       ⎩ endif
endloop
```

FIG. 5

PROXIMITY DETECTOR FOR HARD-TO-DETECT MATERIALS

FIELD OF THE INVENTION

The present invention relates generally to devices used to determine the presence of an object or materials near a sensor and, more particularly, to proximity sensors capable of sensing the presence of materials that are conventionally difficult to detect.

BACKGROUND OF THE INVENTION

A device or system having the ability to detect the presence, level, or quantity of particular materials, commonly referred to as a proximity detector, has many uses. For example, proximity detectors may be used to detect or sense the level of grain, aggregate, fluids or other materials in a storage container, or to detect the presence of a metal part on a production line. While there are different types of proximity sensors available, each suffers from certain disadvantages, making the sensors less desirable for particular applications.

One type of proximity detector is a conventional capacitive sensor. As is known, conventional capacitive sensors are sensitive to changes in the dielectric constant of materials. These sensors typically include the material to be sensed as part of the dielectric material of a tuning capacitor. As the material to be sensed comes into spatial proximity of the capacitive sensor, the dielectric constant of the tuning capacitor changes, altering the capacitance of the tuning capacitor. The altered capacitance either changes the oscillation frequency of the tuned system or the time constant of an RC delay circuit. Either the oscillation frequency or the time constant is then compared to a nominal value (i.e., when the material to be sensed is not near the sensor) to determine the presence of the material. While conventional capacitive sensors are generally useful for detecting certain materials based on the capacitance of the materials, these sensors are generally unable to detect materials based on other electrical properties of the material, such as resistance and/or inductance. Additionally, conventional capacitive sensors are susceptible to changes in certain environmental conditions such as temperature variations.

Ultrasonic proximity detectors exploit reflections of sound waves off an object to detect the presence of the object. The detectors transmit a sound pulse and detect a returning sound wave reflected off the target. By measuring the elapsed round-trip time of the sound wave, the distance to the object can be determined. While these systems may be satisfactory for determining the presence of an object where the distance between the sensor and the object is at least several inches, they are not generally well suited to detect objects that may be very close to the sensor (i.e., less than about two inches) because the echo (i.e., the returning sound wave) becomes difficult to distinguish from the initial transmitted sound pulse. Additionally, the ability of an ultrasonic proximity detector to accurately detect an object or materials may be dependent upon the shape, configuration or surface of the object or materials because, in the typical configuration wherein the sensor acts both as the ultrasonic transmitter and receiver, the transmitted sound wave must reflect off the object or materials and toward the ultrasonic transducer.

Another conventional type of proximity detector is an electromagnetic (EM) wave-based system. EM proximity detectors are similar to ultrasonic systems, but use electromagnetic waves (e.g., microwaves, lasers, and the like) rather than sonic waves. Because the timing requirements for these EM detectors are demanding (typically picosecond resolution), EM-based detectors are expensive. Additionally, EM sensors suffer from at least the same primary disadvantage as ultrasound sensors, i.e., the EM sensors have difficulty detecting objects that may be in close proximity to the sensor because the sensors have difficulty separating the initial transmitted pulse from the returned pulse unless there is a sufficient spacing between the sensor and the object to be detected.

An improved low-power proximity detector is a tuned sensor element. Using this technique, a monopole or dipole element is used as the sensor (i.e., antenna), which is coupled to circuitry designed to be sensitive to the Q of the tuned circuit. As the sensor comes near a lossy material (i.e., a material having a complex permittivity or complex permeability), the Q of the tuned circuit decreases. This decrease in Q can be detected to determine if the material is in proximity to the sensor. Tuned sensors may be packaged as part of an integrated circuit such as, for example, model CS-209A, manufactured by Cherry Semiconductor Corp. of East Greenwich, RI. Conventional tuned sensors, however, are typically designed and/or tuned to detect either high permittivity or high conductivity materials by having a fixed threshold on their detection comparator.

Another type of proximity detector having an oscillation circuit is disclosed in U.S. Pat. No. 5,832,772. This circuit includes a bipolar transistor having its collector coupled to a straight monopole antenna having a characteristic impedance that is dependent upon materials in proximity to the antenna. The transistor and antenna form a resonant circuit that oscillates at a nominal frequency with an amplitude that is dependent on the presence of certain materials in proximity to the antenna. The base of the transistor is coupled to a bias potential, and the emitter of the transistor is coupled to a control circuit which turns the oscillator on and off. A detector circuit is coupled to the emitter junction of the transistor to detect changes in the amplitude of the oscillations as a result of the proximity of the antenna to certain materials. While this proximity detector circuit may have uses in certain areas, it has been found that for particular applications, such as, for example, sensing low permittivity materials, the circuit has certain disadvantages including a lack of sensitivity and susceptibility to fluctuations in external temperature and variations in the components used in the circuit.

Therefore, the need remains for a proximity detector having an oscillation circuit that is more sensitive to low permittivity materials. Preferably, the proximity detector would also be less susceptible to environmental changes (e.g., temperature) and component manufacturing tolerances (e.g., transistor gain) and would be able to detect the presence of conventionally hard-to-detect materials.

SUMMARY OF THE INVENTION

An apparatus for detecting the proximity of conventionally hard-to-detect materials having these features and satisfying these needs has now been developed. The current invention allows for accurate detection of the proximity of hard-to-detect materials. As used herein, the phrase hard-to-detect materials generally means materials having a low relative permittivity (e.g., epsilon approximately 2) such as, for example, bulk materials having a relatively low water content (e.g., animal feeds), petroleum products, and polymers (i.e., plastics). Of course, the present invention may also be used to detect other materials or objects without departing from the spirit and scope of the invention. For example, the present invention may also be used to detect the presence of certain high permittivity materials such as, for example, certain aqueous solutions, antifreeze (ethylene glycol), and/or other high conductivity materials, such as metals. The present invention also allows for the detection of these materials using a novel circuit design that operates on low power, is capable of detection across a wide temperature range, and is less sensitive to component variations.

Broadly speaking, the proximity detector of the present invention operates by reacting to certain electrical properties of materials near or surrounding the detector's sensor. The preferred proximity detector includes a high-frequency oscillator that is electrically coupled to a tuned circuit that includes a sensor element. As the sensor element comes in near proximity of a lossy material (i.e. a material having a complex permittivity or complex permeability), the Q of the tuned circuit decreases, thereby diminishing the amplitude of the oscillations of the high-frequency oscillator. By periodically detecting and measuring the amplitide of the oscillations, the proximity detector can determine the presence of a sensed material near the sensor element.

Preferably, the proximity detector of the present invention includes an oscillator for producing an output signal at a predetermined frequency. Preferably, the oscillator generates its output signal using a conventional transistor having a base, an emitter and a collector, wherein the base-emitter junction rectifies resonant signals at the collector to produce the output signal. Preferably, the oscillator further includes negative feedback for reducing the sensitivity of the closed loop gain to variations in the transistor's open loop gain and for stabilizing the frequency of the oscillator. The negative feedback is preferably provided by a resistive element operatively coupled to the emitter and a capacitive element operatively coupling the resistive element to the collector.

The preferred proximity detection system also includes a sensor operatively coupled to the oscillator for varying the level of the oscillator output signal in response to variations in external electrical properties near the sensor and a controller operatively coupled to the oscillator to receive the oscillator output signal and being responsive to variations of predetermined magnitudes of the amplitudes of the oscillator output signal for detecting the presence or level of the material. Preferably, the sensor has a novel geometry consisting of two substantially flat plates that may be sized and positioned to control the polarization orientation of the electric field lines extending from the sensor so that the field lines extend substantially normal to the surface of the plates and, therefore, extend farther away from the sensor and potentially intersect a greater volume of material. In one embodiment, the two plates are positioned perpendicular to each other. In another embodiment, the two plates are co-planar with a lateral separation region therebetween. Using either configuration, a high dielectric material (e.g., alumina) may be placed on the side of the sensor proximal to the material to be detected to further reposition the electric field lines in a direction toward the material to be sensed.

In a preferred embodiment, the controller issues a gate signal that is coupled to the oscillator for turning the oscillator on at a predetermined frequency and for a predetermined pulse width. Synchronously with the control of this gate signal, the controller receives the oscillator output signal, thus reducing the overall power requirements of the system.

BRIEF DESCRIPTION OF THE DRAWINGS

These and other features, aspects, and advantages of the present invention will become better understood with regard to the following description, appended claims, and accompanying drawings wherein:

These drawings are provided for illustrative purposes only and should not be used to unduly limit the scope of the present invention.

DETAILED DESCRIPTION OF THE INVENTION

Figure 1:
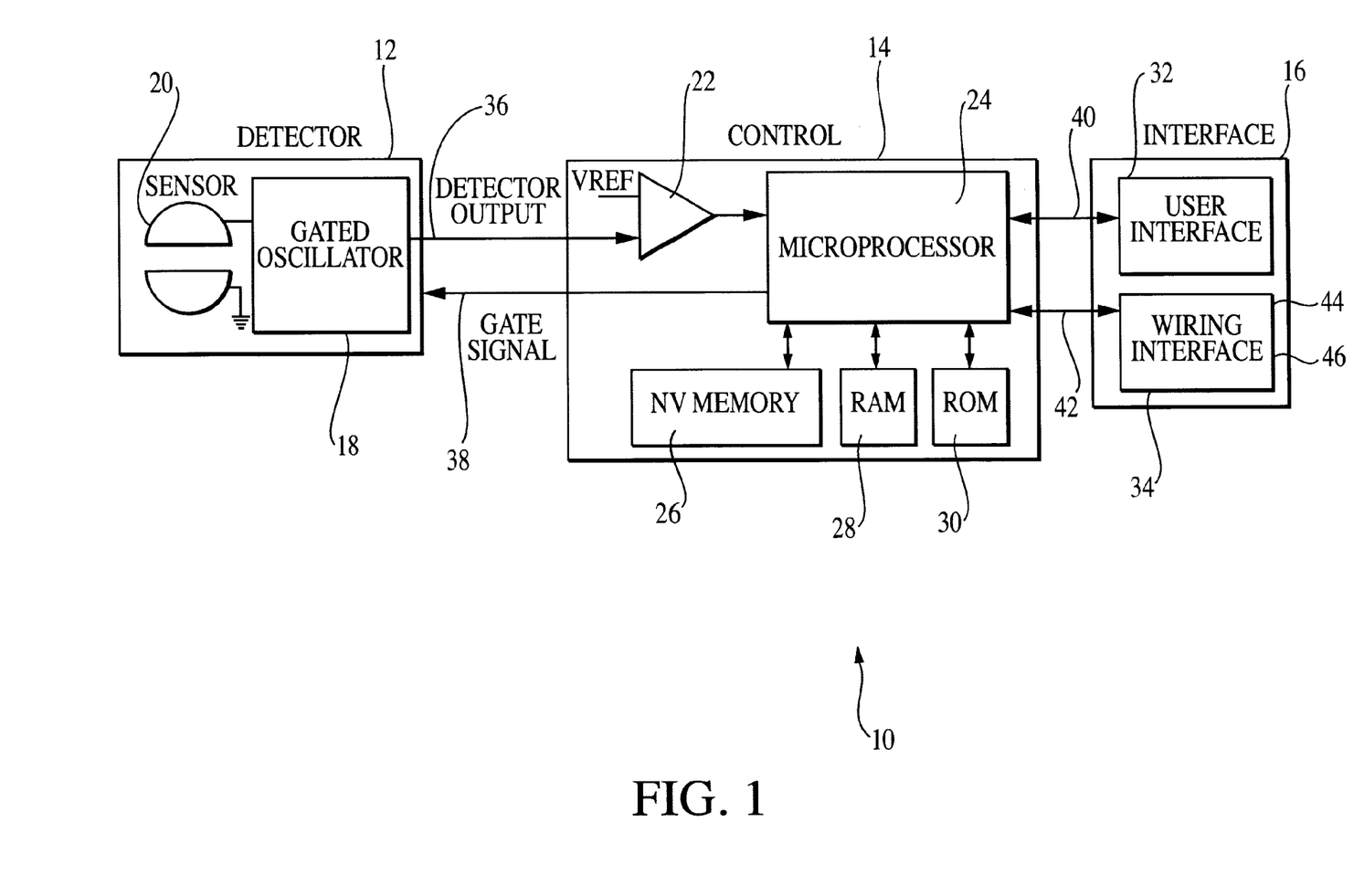
FIG. 1 is a diagrammatic representation of a proximity detector in accordance with a preferred embodiment of the present invention.

FIG. 1 illustrates a preferred embodiment of the proximity detection system 10 of the present invention. The proximity detection system 10 including detector 12, controller 14, and interface unit 16. The detector 12 preferably includes a gated oscillator circuit 18 connected to sensor 20. Preferably, the controller 14 and the detector 12 are packaged together, along with interface unit 16, in a compact unit. Alternatively, the detector 12 may be packaged as a separate, removable component that is electrically connected to the controller 14 using an electrical wiring interface that allows the sensor element 20 to be used a large distance from the remainder of the system 10. For example, the remaining components may be packaged together in an environmentally-protected package, while the detector 12 may be hand-carried though a facility that may house particular materials to be detected. The detector 12, controller 14, and interface unit 16 are preferably packaged depending on the particular environmental conditions that may be exposed to the components such as, for example, humidity, water, dust, and the like. The primary elements of the proximity detector system 10 may be packaged in other ways as determined by one skilled in the art.

The sensor element 20 is preferably designed to be sensitive to a large volume of material, thus enabling the proximity detection system 10 to detect the presence of materials having a low permittivity. As is known, conventional detector systems typically use a monopole or dipole antenna as their sensing element, which have electric and magnetic field lines that are heavily concentrated around the sensor and generally extend parallel to the surface of the sensor.

Preferably, sensor element 20 is configured to reposition the electric field lines to extend normal to the surface of the sensor element 20, thus increasing the sensitivity of the proximity detection system 10. In one preferred configuration illustrated in FIG. 2a, sensor element 20 comprises two substantially flat plates, a signal plate 20a and a ground potential return plate 20b preferably aligned substantially perpendicular to the signal plate 20a. The ground potential return plate 20b may be buttressed against the signal plate 20a to provide support or may be separated from the signal plate 20a by a separation region 21. Unlike conventional dipole antennas, wherein the field lines extend primarily parallel to the surface of the antenna, use of this preferred sensor element 20 changes the polarization orientation of the field lines 44 so that the field lines 44 extend primarily normal to the surface of the flat plates, 20a and 20b, thus allowing the field lines 44 to extend and intersect with a greater volume of material placed near the sensor element 20, thus improving the sensitivity (i.e., responsiveness) of the proximity detection system 10 and enabling the detection of materials with a relative permittivity near 1. By having field lines 44 with a polarization orientation normal to the surface of the sensor element 20, the proximity detection system 10 is also less sensitive to a film of material that may collect on the sensor element, a common problem with conventional capacitive proximity sensors, and, thus is more reactive to bulk materials.

Figure 2A:
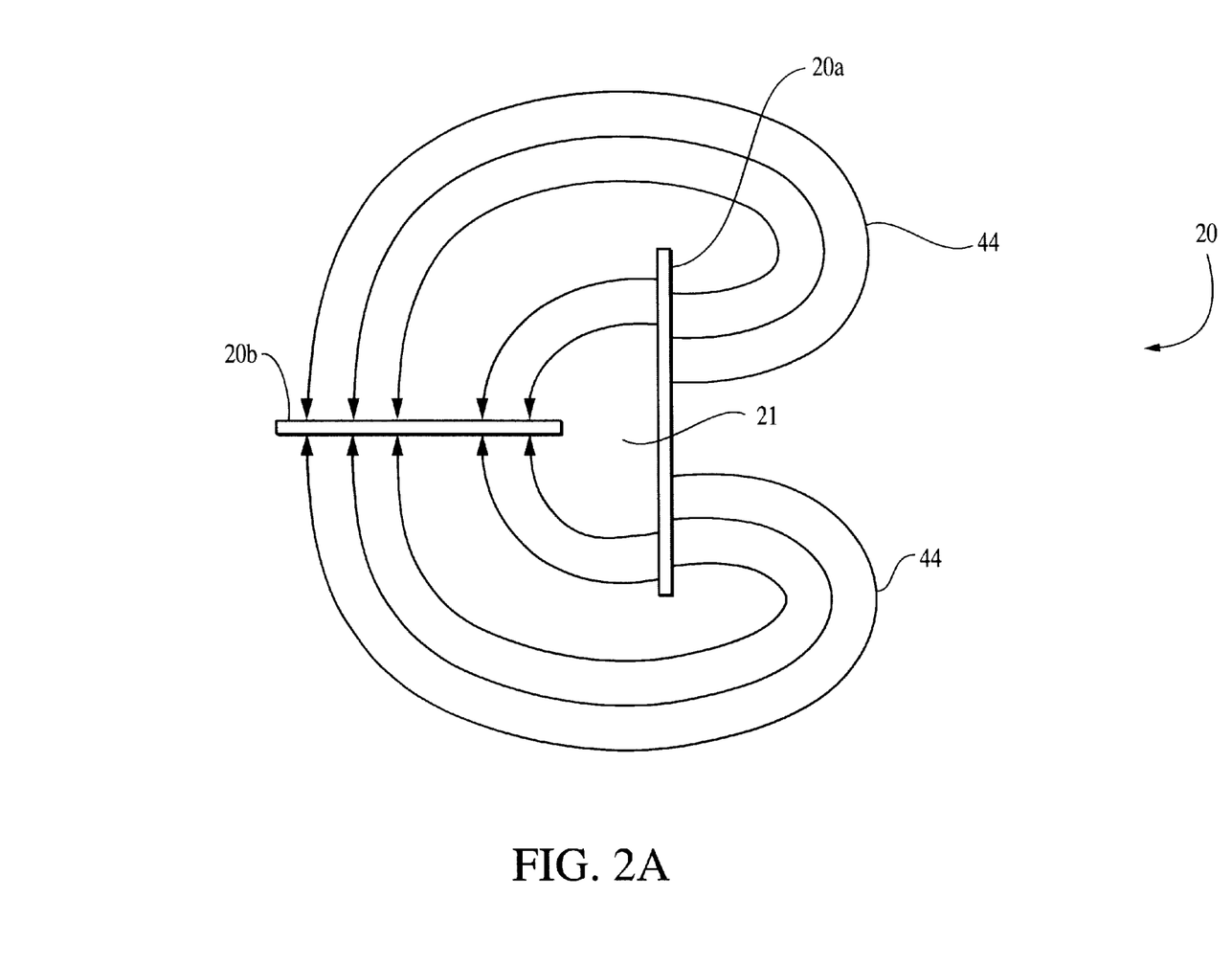
FIGS. 2a and 2b are schematic views illustrating two presently preferred embodiments of the sensor element of the present invention showing the electric field lines extending therefrom.
Figure 2B:
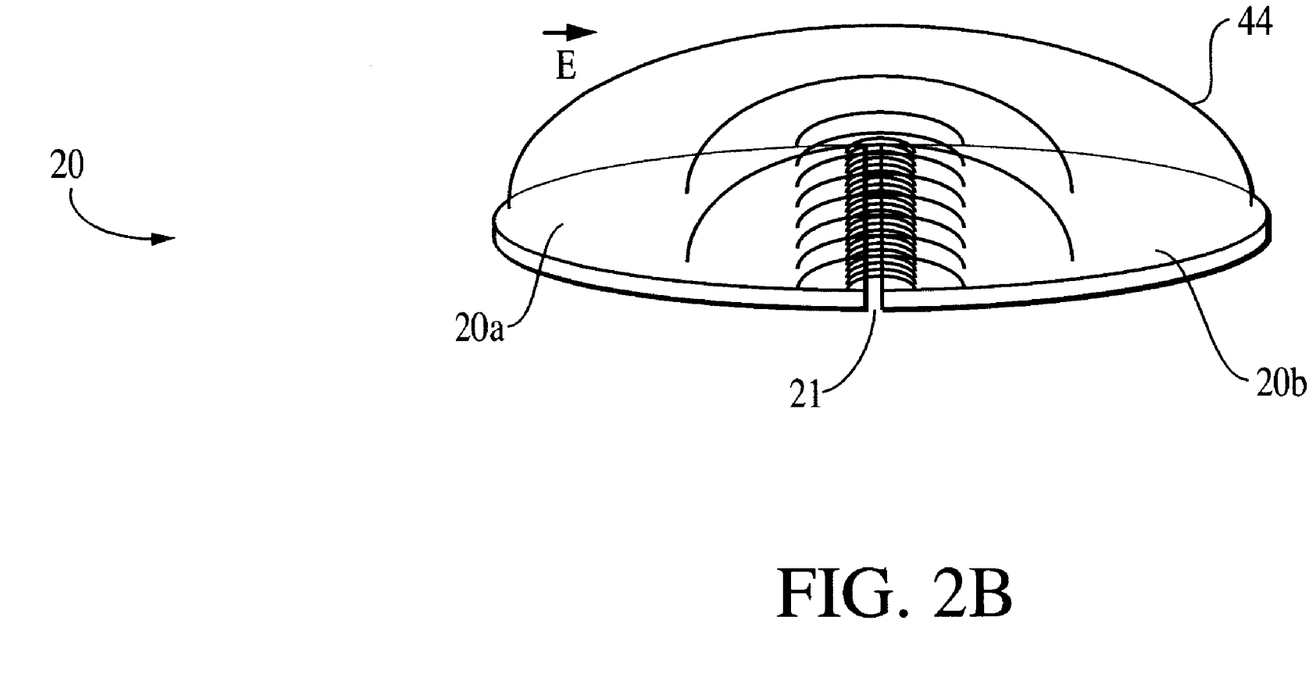

Another preferred geometry is illustrated in FIG. 2b, in which sensor element 20 comprises two substantially flat co-planar plates, a signal plate 20a and a ground potential return plate 20b, providing a lateral separation region 21 between the two plates. In this configuration, the lateral separation region 21 forces the electric field lines 44 generated by the sensor 20 to have a polarization orientation normal to the surface of the two plates, 20a and 20b. Using this geometry, the electric field lines 44 also potentially intersect a greater volume of material, thus improving the sensitivity of the proximity detection system 10.

Preferably, the two plates 20a and 20b are manufactured using copper.

Alternatively, the plates 20a and 20b may be made from brass or any other material having similar high conductivity properties. In the preferred embodiment shown in FIG. 2a, the signal plate 20a is preferably circular and the ground potential return plate 20b is preferably rectangular In the preferred embodiment illustrated in FIG. 2b, the sensor element 20 is comprised of two semi-circular plates 20a and 20b, is substantially circularly shaped having a diameter of about one inch (assuming the two plates 20a and 20b are placed together), and the lateral separation region 21 is approximately three-sixteenths of an inch. The lateral separation region 21 may be adjusted to extend the electric field lines 44 farther away from the surface of the sensor element 20 and, thus, the element 20 will intersect material that is at a greater distance from the sensor element 20. Additionally, in both presently preferred configurations, the surface area of the plates 20a and 20b may be increased to produce field lines 44 that extend a greater distance from the sensor element 20. While FIG. 2 illustrates the presently preferred configurations for the sensor element 20, other configurations may be used for the sensor element 20 including square, oval, or rectangular, without departing from the spirit and scope of the present invention. Additionally, a conventional dipole antenna constructed using a wire or metal rod may be used as sensor element 20.

Preferably, the sensor element 20 includes features designed to further control the position and orientation of the field lines 44 extending therefrom. For example, the sensor element 20 may include a dielectric material thinly layered on the surface of the signal plate 20a distal to the material to be detected. This dielectric layer can preferably reposition the field lines in the material.

The sensor element 20 may also be configured to control and reposition the field lines 44 by adjusting the geometry of the surface of the signal plate 20a. For example, the surface of the signal plate 20a proximal the material to be detected may be coated with a thin film of high dielectric material (e.g., alumina ($Al_2O_3$) or another similar material) capable of repositioning the electric field lines 44 in the direction toward the material to be sensed. Preferably, the film is tapered across the surface of the signal plate 20a, for example, by layering the film thicker on the outer circumference of the plates 20a and 20b. Thus, the proximity detection system 10 can be tailored to concentrate the field lines 44 to a particular volume of space.

As further described below, when commanded from the controller 14, via gate signal 38, the gated oscillator circuit 18 (along with the sensor element 20) attempts to oscillate at its resonant frequency. As the sensor element 20 is placed in spatial proximity to certain materials, the spatial area into which the electric field lines 44 project effects the electrical properties of the sensor element 20. The sensor element 20 is coupled to the circuit 18 such that, in the event that the sensor element 20 is placed in near proximity to a sufficient quantity of material having certain characteristics (i.e., a material having a complex permittivity or complex permeability), the merit factor Q of the gated oscillator circuit 18 will decrease and the oscillations of the circuit 18 will correspondingly diminish. By detecting these diminished oscillations, the proximity detection system 10 can detect the proximity of certain hard-to-detect materials.

Figure 3:
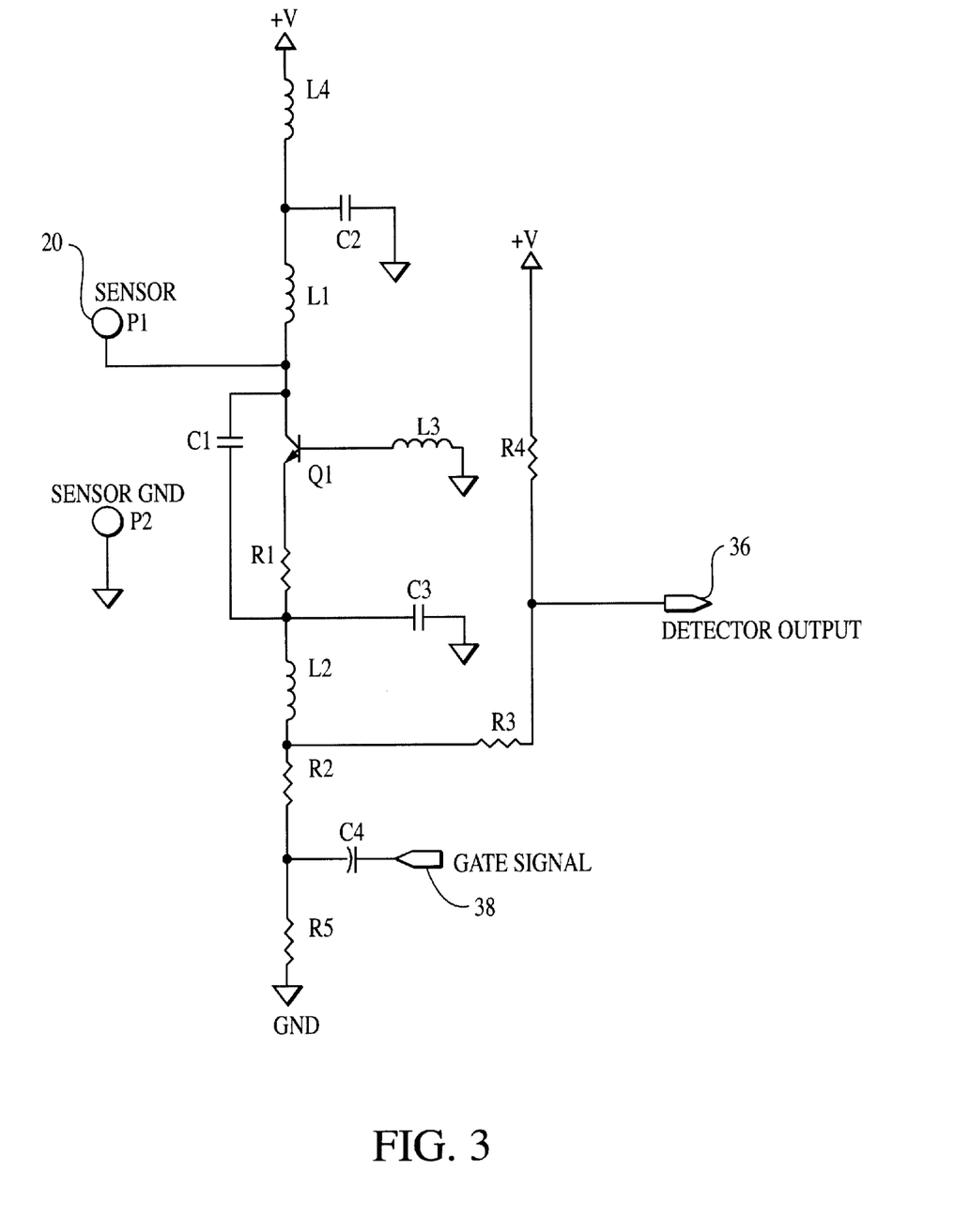
FIG. 3 is a circuit level diagram of the preferred gated oscillator circuit of the present invention.

Referring now to FIG. 3, therein is shown a preferred embodiment of the gated oscillator circuit 18 in accordance with the principles of the invention. This type of oscillation circuit is generally described in U.S. Pat. No. 5,832,772, the contents of which are incorporated herein in its entirety for all purposes. The oscillator circuit 18 includes transistor Q1. The collector of transistor Q1 is coupled to a supply voltage V through inductive elements L1 and L4 in series. Any well known d.c. power supply design may be used to provide the supply voltage V such as battery-driven power supply or a transformer-coupled linear regulator with an appropriate rectifier. The base of transistor Q1 is tied through inductive element L3 to ground potential. A capacitive element C2 is coupled between the node connecting inductive elements L1 and L4 to ground potential. The collector of transistor Q1 is also coupled to the sensor element 20. The emitter of transistor Q1 is coupled through a resistive element, such as emitter degeneration resistor R1, then to inductive element L2, then to resistive element R2, and finally through resistive element R5 to ground potential. A capacitive element C3 connects the juncture between resistive element R1 and inductive element L2 to ground potential. The node between inductive element L2 and resistive element R2 is connected in series through resistive elements R3 and R4 to the supply voltage V. The detector output 36 of the gated oscillator circuit 18 extends from the node coupling resistive elements R3 and R4. Capacitive element C4 is coupled to the node between resistive elements R2 and R5 to the gate signal 38.

As described above, the oscillation circuit 18 includes a negative feedback loop that provides certain beneficial properties to the circuit 18. The emitter degeneration resistor R1 is coupled in series to the emitter terminal of transistor Q1 and provides a means for reducing the closed loop gain of the oscillator formed by Q1 and for reducing the sensitivity of the closed loop gain to variations in the transistor's open loop gain. Thus, preferably, the emitter degeneration resistor R1 decouples the closed loop gain of the oscillation circuit 18 from the specific value of the open loop gain generally provided by the transistor Q1.

Additionally, preferably, a feedback capacitive element C1 is coupled between the collector and the emitter terminals of transistor Q1, thus allowing the overall capacitance of the oscillator circuit 18 to be controlled to a greater degree thereby stabilizing the frequency that the circuit 18 oscillates. The dependency of the frequency of the oscillator on the parasitic collector-emitter capacitance associated with transistor Q1 is thereby reduced, thus further improving the oscillator's sensitivity to both component variations and ambient temperature variations.

The preferred oscillator circuit 18 described herein, when coupled to the sensor element 20, is responsive to the presence of materials having complex permittivity and/or complex permeability and, because of the added emitter degeneration resistor R1 and the feedback capacitive element C1, is sensitive to variations in electrical properties of such materials, including capacitance, resistance, and inductance. The ability to detect materials based on properties other than simply capacitance greatly enhances the usefulness of the preferred oscillator circuit 18. While the preferred circuit 18 described herein is optimized to be responsive to electric fields, the circuit 18 is also sensitive to magnetic field fluctuations. Tests conducted using this preferred circuit 18 also have demonstrated that the circuit is less sensitive to variations in external temperature, increasing the usefulness of the proximity detection system 10. In one test, the proximity detection system 10 was used at various temperature ranges to detect the presence of animal feed. The preferred system 10 was able to successfully detect the material across a temperature range of at least −20° to 140° F. By comparision, a conventional proximity detector, such as described in U.S. Pat. No. 5,832,772, successfully detected the same material across a temperature range only between 55° and 110° F.

The following table provides the presently preferred component values for the electrical components of oscillator circuit 18, assuming the circuit is operating at 1.0 GHz:

| COMPONENT | PREFERRED VALUE |
|---|---|
| Q1 | BFR92ALT1 (Motorola) |
| R1 | 30.1 Ω |
| R2 | 1 kΩ |
| R3 | 4.99 kΩ |
| R4 | 20 kΩ |
| R5 | 4.99 kΩ |
| C1 | 1 pF |
| C2 | 0.01 µF |
| C3 | 1 pF |
| C4 | 10 µF |
| L1 | 10 nH |
| L2 | 220 nH |
| L3 | 10 nH |
| L4 | 220 nH |

While certain nominal values for the various resistive, capacitive, and inductive elements contained within oscillation circuit 18 have been provided herein, other values may be appropriate for use in connection with other materials whose proximity is to be detected. Such other values may be readily determined by one skilled in the art.

The detector output 36 of the gated oscillator 18 is fed into a comparator 22 contained within the controller 14 as described below. Controller 14 is generally responsible for overall system operation and preferably includes a conventional microprocessor 24, and associated non-volatile memory 26, random access memory 28, and read-only memory 30. The microprocessor 24 and associated memory may be packaged together as part of a conventional microcontroller such as model AT90S1200 from Atmel Corp. of San Jose, Calif., which incorporates an 8-bit processor, ROM, RAM, non-volatile memory, several input/output ports, and an analog comparator.

The microprocessor 24 is responsible for controlling the gate signal 38 to command oscillation of the circuit 18. Preferably, the microprocessor 24 enables the gate signal 38 at a low frequency (e.g., 40 Hz) to conserve power. Of course, in the event that the amount of power consumed by the system 10 is not a design factor, the microprocessor may enable the gate signal 38 at a higher frequency or may continuously enable the gate signal 38. While the detector 12 is enabled (i.e., the gate signal 38 is set low), the microprocessor 24 reads the output of the comparator 22, which reflects the presence (or absence) of particular materials in near proximity to the sensor 20. Based upon this reading and in accordance with the particular application the proximity detection system 10 is configured for, the microprocessor 24 issues commands via output lines 42 to the wiring interface 34 to instruct the control outputs 44 and 46 to either their open or closed state. At the end of the measurement pulse (which may extend, for example, for about 10–150 microseconds), the microprocessor 24 disables the gate signal 38 (i.e., sets the signal high) and waits until the initiation of the next measurement pulse. The preferred proximity detection system 10 operates at low power because the duration of each measurement pulse (e.g., 10–150 microseconds) is significantly less than the period of the system (e.g., 25 msec when operating at 40 Hz). Additionally, because the duty cycle and measurement pulses are under software control, the microprocessor 24 can control when the detector output 36 should be read, eliminating the need for pulse stretcher circuitry common with conventional proximity detectors.

Controller 14 preferably includes an analog comparator 22, which receives as inputs the detector output 36 and a reference voltage, $V_{ref}$. The reference voltage is dependent on the particular component values used in circuit 18 and is preferably set to the midpoint between the detector output voltage indicating the presence and absence of material. The reference voltage may be tailored to the particular materials intended to be detected. The analog comparator 22 compares the detector output 36 to $V_{ref}$ and provides the result of this comparison, which indicates whether the amplitude of the oscillations of circuit 18 have diminished below a certain threshold indicating the proximity of hard-to-detect materials near the sensor element 20, to the microprocessor 24.

The gated oscillator is a particularly important aspect of the present invention because, depending on the particular application and configuration, it significantly reduces the power required to operate the preferred proximity detector. Prior art gated oscillators require a peak detection circuit and/or a pulse stretching circuit coupled to the output of a comparator. Preferably, the present invention controls or gates the oscillation circuit directly from microprocessor 24. As the timing of the oscillator gate is known and controlled by the microprocessor 24, the microprocessor 24 can sample the output of comparator 22 synchronously with the oscillation circuit 18, i.e., only while the oscillation circuit is active and operating such that it may detect the presence of certain material. This preferred feature reduces the total power required to operate the proximity detection system 10 and significantly reduces the quantity and/or complexity of component parts for the system. Additionally, software executing in the microprocessor 24 is generally capable of dynamically controlling the frequency of the gate, which may not be accomplished using conventional gate oscillators. This dynamic control over the oscillator gate further reduces the power consumed by the proximity detection system 10.

Additionally, the frequency and duty cycle of the oscillator gate may be changed on a cycle by cycle basis.

The interface unit 16 preferably includes a user interface 32 (connected to controller 14 via lines 40) and a wiring interface 34 (connected to controller 14 via output lines 42). Preferably, the user interface 32 includes a mechanism to allow an operator of the proximity detection system 10 to initialize and operate the system 10, and to allow the operator to modify certain performance characteristics of the system 10 after it has been installed for use, an example of which is described below.

Figure 4:
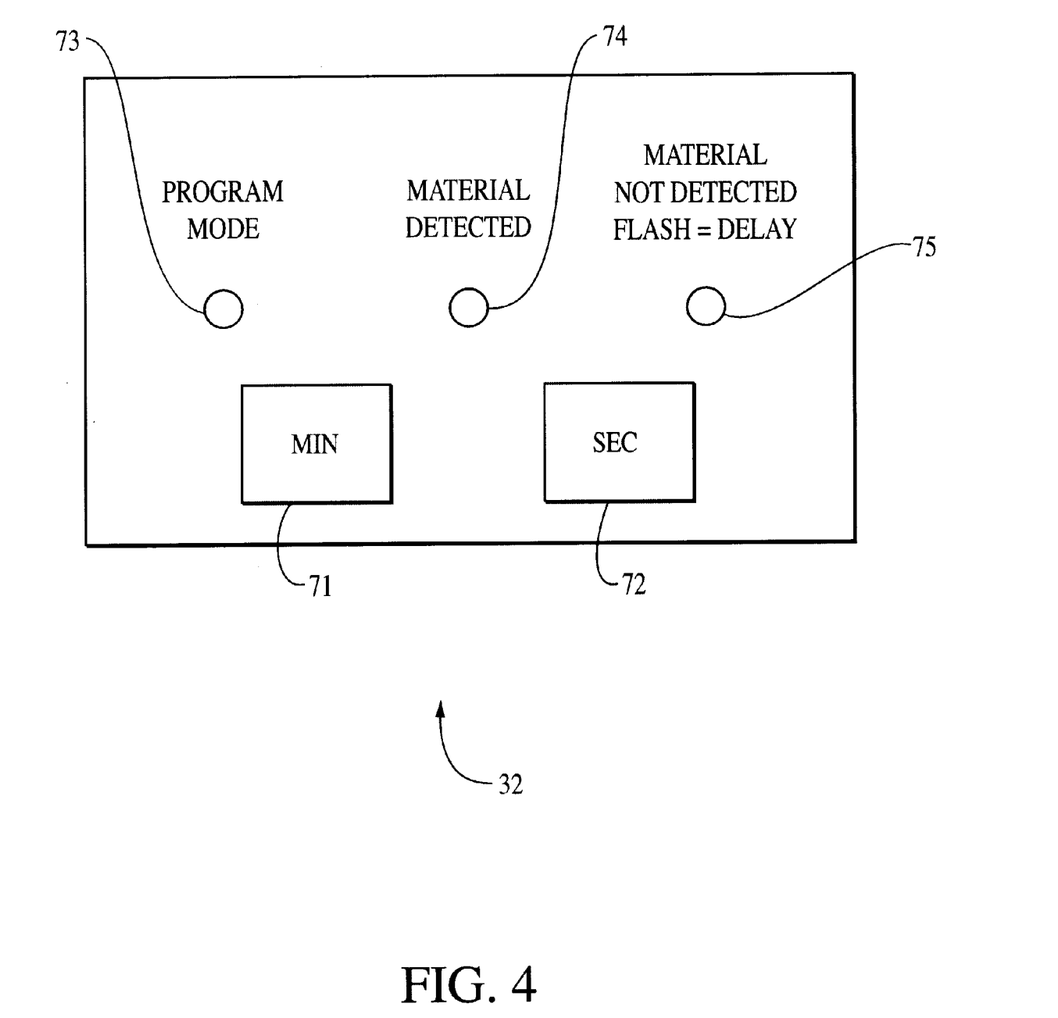
FIG. 4 is a representation of a preferred user interface for the present invention.

A representative user interface 32 is shown in FIG. 4, which includes two pushbuttons, 71 and 72, and three separate, high efficiency light emitting diodes (LEDs), 73, 74, and 75. Alternatively, a tri-color LED may be used in lieu of the three separate LEDs. Preferably, the user interface 32 uses the LEDs to communicate the status of the detection of certain materials to the system operator. For example, one of the LEDs, for example LED 75, may be turned on (or the tri-color LED may be set to a particular color) when the system 10 is not detecting the presence of the materials and the control outputs 44 and 46 are in their respective default states, i.e., the normally open control output 44 is open and the normally closed control output 46 is closed. Another LED, for example LED 74, may be turned on (or the color of the tricolor LED changed) when the control outputs 44 and 46 are in an active state (indicating that the sensor 20 is in proximity to certain hard-to-detect materials). The system may preferably indicate that the system is transitioning from the activated state to the default state (no materials sensed), by, for example, flashing an LED on and off.

A preferred embodiment of the present invention includes the use of wiring interface 34, which provides, for example using a three-wire interconnect, power to the proximity detection system 10 and both normally-open and normally-closed control outputs 44 and 46. The control outputs 44 and 46 are preferably set in their default states when no material is detected by the system 10 and transition to an active state upon detection of materials, wherein the normally open control output 44 is closed and the normally closed control output 46 is open. Preferably, a programmable time delay is incorporated into the system such that the system ensures that materials are no longer in proximity before transitioning the control outputs 44 and 46 back to their respective default states. Thus, the system is more stable because slight variations in the detection of materials will not alter the state of the control outputs 44 and 46 until the system has had an opportunity to fully detect the absence or presence of materials.

Figure 5:
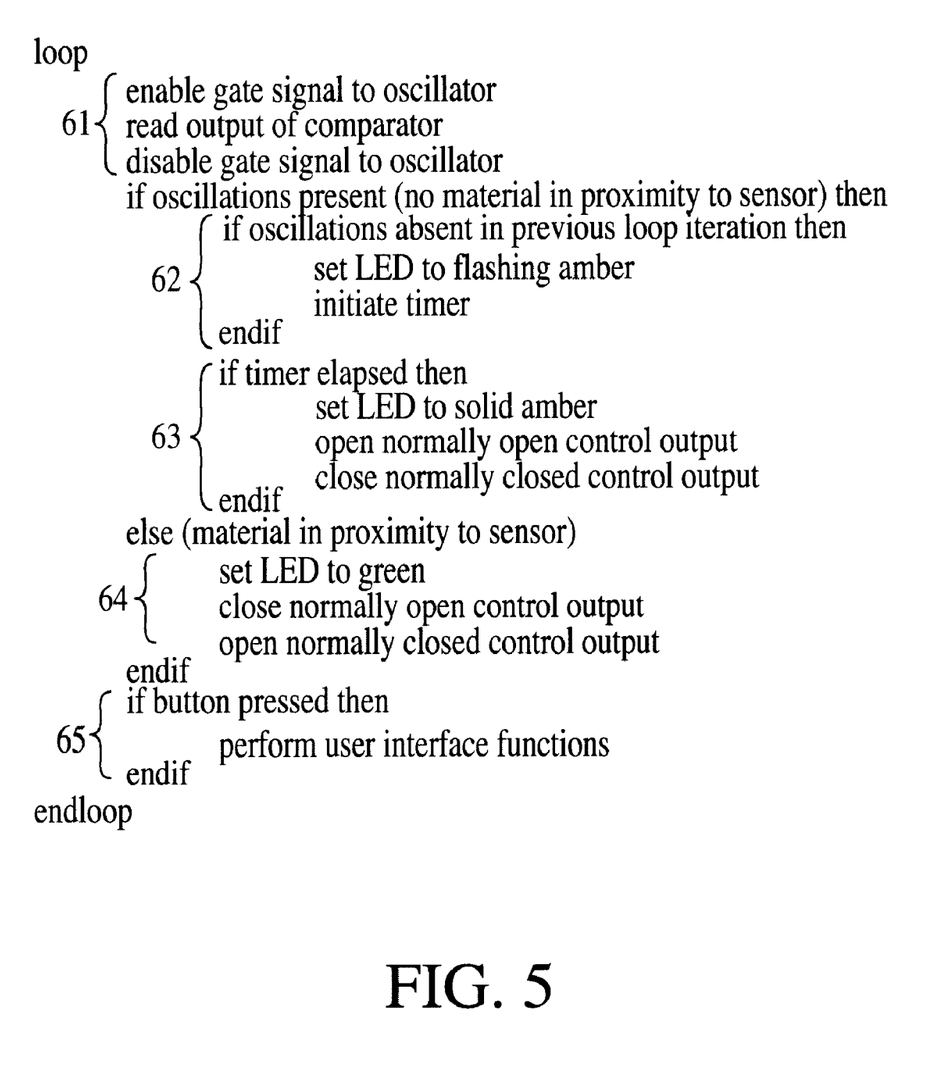
FIG. 5 is a pseudo-code representation of the major processing blocks of the controller function of the present invention.

FIG. 5 illustrates a preferred method executing within microprocessor 24. The method operates in a repetitive loop as long as power is supplied to the proximity detection system 10. Initially, in block 61, the microprocessor 24 enables the gate signal 38 to the gated oscillator circuit 18, reads the comparator output 25 and then disables the gate signal 38. In block 62, if the amplitude of the oscillations is larger than a predetermined value (as indicated by the comparator output), which indicates that no materials to be sensed exist in proximity to the sensor 20, the system will determine if the sensor 20 detected materials during the last system frame. If materials were detected the previous frame (meaning that this is a first iteration of the system wherein the materials are no longer detected), the system will turn on an appropriate LED (or initiate the flashing of the tri-color LED) and initiate a timer to light (or flash) the LED for a predetermined amount of time. After this timer expires, the system will, as shown in block 63, turn off the LED (or set the tri-color LED to a solid color), open the normally open control output, and close the normally closed control output. Once the system detects the presence of materials, as shown in block 64, the system will turn on a different LED (or change the color of the tri-color LED), close the normally open control output, and open the normally closed control output.

The preferred method also responds to a push-button depression on the user interface 32. A push-button depression is detected and control transfers to respond to the depression and perform certain user interface functions. As an example of one user interface function that may be programmed into the system, the duration of time that the LED is lit or the LED is set to flash as the system is transitioning from the active state (material detected) to the default state (no material detected), i.e., the delay time, may be programmed via the user interface 32. As an example implementation, to program or modify the delay time, the operator preferably depresses both pushbuttons 71 and 72 simultaneously. One of the LEDs may be lit or flash to indicate to the operator that the system has entered into the programming mode and the delay time is reset to zero. The operator may then use the pushbuttons 71 and 72 to increment the delay time. One or more LEDs may glow as the pushbuttons are depressed to provide positive feedback to the operator. Once the appropriate delay time is selected, the operator may exit the programming mode by, for example, simultaneously depressing both pushbuttons or refrain from pushing any button for a certain amount of time, for example five seconds. The modified value for the delay time is preferably stored in the nonvolatile memory 26 and maintained in the event power is removed from the system. As one skilled in the art will readily appreciate, the user interface 32 may be used for functions other than those described herein, such as, for example, calibration or test, without departing from the spirit and scope of the present invention. Moreover, additional and/or other types of input/output devices may be incorporated into the user interface 32 for particular applications of the present invention such as a numerical display of the delay time.

Although the present invention has been described in considerable detail with reference to certain presently preferred embodiments thereof, other embodiments are possible without departing from the spirit and scope of the present invention. Therefore the appended claims should not be limited to the description of the preferred versions contained herein.

We claim:

1. A proximity detection system for detecting the presence or level of material comprising:

an oscillator that produces an output signal, the oscillator comprising a transistor having a base, an emitter and a collector, the transistor having an open and a closed loop gain and a base-emitter junction that rectifies resonant signals at the collector to produce the output signal, the oscillator further comprising negative feedback for reducing the sensitivity of the closed loop gain to variations in the transistor's open loop gain and for stabilizing the frequency of the oscillator;

a sensor operatively coupled to the oscillator for varying the level of the oscillator output signal in response to electrical properties of the material; and a controller operatively coupled to the oscillator to receive the oscillator output signal and being responsive to variations of predetermined magnitudes of the amplitudes of the oscillator output signal for detecting the presence or level of the material, wherein the oscillator and the sensor have a merit factor Q, the merit factor Q decreasing as the sensor is placed in proximity to the material and wherein the amplitude of the oscillations of the oscillator will correspondingly diminish as the merit factor Q decreases, and wherein the oscillator output signal indicates the amplitude of the diminished oscillations.

2. The proximity detection system of claim 1 wherein the negative feedback comprises a feedback resistive element having a first node connected to the emitter and a second node connected to a ground potential through a first capacitive element, the second node further connected to the ground potential through a first inductive element in series with a first and second resistive elements, and a feedback capacitive element connected to the second node of the feedback resistive element and the collector, and wherein the oscillator further comprises:

second and third inductive elements connected in series between a power source and the collector;

a second capacitive element connected between the second and third inductive elements and the ground potential; and     a fourth inductive element connecting the base to the ground potential.

3. The proximity detection system of claim 1 wherein the material to be detected has a low permittivity.

4. A proximity detection system for detecting the presence or level of material comprising:

an oscillator that produces an output signal, the oscillator comprising a transistor having a base, an emitter and a collector, the transistor having an open and a closed loop gain and a base-emitter junction that rectifies resonant signals at the collector to produce the output signal, the oscillator further comprising negative feedback for reducing the sensitivity of the closed loop gain to variations in the transistor's open loop gain and for stabilizing the frequency of the oscillator;

a sensor operatively coupled to the oscillator for varying the level of the oscillator output signal in response to electrical properties of the material, wherein the sensor has electrical field lines extending outwardly therefrom, and wherein the sensor is adapted to reposition the polarization orientation of the field lines so that the lines extend substantially normal to the surface of the sensor; and     a controller operatively coupled to the oscillator to receive the oscillator output signal and being responsive to variations of predetermined magnitudes of the amplitudes of the oscillator output signal for detecting the presence or level of the material.

5. The proximity detection system of claim 4 wherein the sensor comprises two substantially flat co-planar plates having a lateral separation region therebetween, the sensor having electric field lines extending between the two plates with a polarization orientation normal to the surface of the sensor.

6. The proximity detection system of claim 5 wherein the lateral separation region is sized to control and position the electric field lines extending from the sensor to allow the sensor to respond to material properties in a larger or smaller spatial region in proximity to the sensor.

7. The proximity detection system of claim 5 wherein each plate has a proximal and a distal surface in relation to the material to be detected, and wherein the sensor comprises a film of dielectric material tapered across the proximal surfaces of the plates for repositioning the polarization orientation of the field lines.

8. The proximity detection system of claim 4 wherein the sensor comprises a flat signal plate having a proximal surface oriented in a direction toward the material to be detected and a distal surface, and a ground potential return plate, the ground potential return plate positioned substantially perpendicular and adjacent to the distal surface, for repositioning the polarization orientation of the field lines.

9. The proximity detection system of claim 8 wherein the sensor further comprises a film of dielectric material tapered -across the proximal surface of the signal plate for repositioning the polarization orientation of the field lines further.

10. A sensor for use with a proximity detector adapted to detect the presence of material, the detector comprising an oscillation circuit, the sensor being electrically coupled to the oscillation circuit and having electrical field lines extending outwardly from a surface of the sensor, the sensor adapted to reposition the polarization orientation of the field lines so that the lines extend substantially normal to the surface of the sensor.

11. The sensor of claim 10 further comprising two substantially flat co-planar plates having a lateral separation region therebetween, the sensor having electric field lines extending between the two plates with a polarization orientation normal to the surface of the sensor.

12. The sensor of claim 11 wherein the lateral separation region is sized to control and position the electric field lines extending from the sensor to allow the sensor to respond to material properties in a larger or smaller spatial region in proximity to the sensor.

13. The sensor of claim 12 wherein each plate has a proximal and a distal surface in relation to the material to be detected, and wherein the sensor comprises a film of dielectric material tapered across the proximal surfaces of the plates to reposition the polarization orientation of the field lines.

14. The sensor of claim 10 further comprising a flat signal plate having a proximal surface oriented in a direction toward the material to be detected and a distal surface, and a ground potential return plate, the ground potential return plate positioned substantially perpendicular and adjacent to the distal surface, to reposition the polarization orientation of the field lines.

15. The sensor of claim 14 further comprising a film of dielectric material tapered across the proximal surface of the signal plate to reposition the polarization orientation of the field lines.

16. A sensor for use with a proximity detector adapted to detect the presence of material and having electrical field lines extending outwardly from a surface of the sensor, the sensor adapted to reposition the polarization orientation of the field lines so that the lines extend substantially normal to the surface of the sensor.

17. The sensor of claim 16 further comprising two substantially flat co-planar plates having a lateral separation region therebetween, the sensor having electric field lines extending between the two plates with a polarization orientation normal to the surface of the sensor.

18. The sensor of claim 16 wherein the lateral separation region is sized to control and position the electric field lines extending from the sensor to allow the sensor to respond to material properties in a larger or smaller spatial region in proximity to the sensor.

19. The sensor of claim 18 wherein each plate has a proximal and a distal surface in relation to the material to be detected, and wherein the sensor comprises a film of dielectric material tapered across the proximal surfaces of the plates to reposition the polarization orientation of the field lines.

20. The sensor of claim 16 further comprising a flat signal plate having a proximal surface oriented in a direction toward the material to be detected and a distal surface, and a ground potential return plate, the ground potential return plate positioned substantially perpendicular and adjacent to the distal surface, to reposition the polarization orientation of the field lines.

21. The sensor of claim 20 further comprising a film of dielectric material tapered across the proximal surface of the signal plate to reposition the polarization orientation of the field lines.

* * * * *

UNITED STATES PATENT AND TRADEMARK OFFICE
CERTIFICATE OF CORRECTION

PATENT NO.     : 6,446,012 B1
DATED          : September 3, 2002
INVENTOR(S)    : David C. Macke, Sr. et al.

It is certified that error appears in the above-identified patent and that said Letters Patent is hereby corrected as shown below:

<u>Title page,</u>
Item [73], Assignee, replace "BFCS Technologies, Inc." with
-- BECS Technologies, Inc. --

Item [75], Inventors, replace "both of MD" with -- both of MO --

Signed and Sealed this

Eighth Day of April, 2003

JAMES E. ROGAN
*Director of the United States Patent and Trademark Office*